(12) United States Patent
Matsuda

(10) Patent No.: US 7,348,273 B2
(45) Date of Patent: Mar. 25, 2008

(54) METHOD OF MANUFACTURING A SEMICONDUCTOR DEVICE

(75) Inventor: Tomoko Matsuda, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 80 days.

(21) Appl. No.: 11/094,393

(22) Filed: Mar. 31, 2005

(65) Prior Publication Data
US 2005/0250326 A1 Nov. 10, 2005

(30) Foreign Application Priority Data
Mar. 31, 2004 (JP) ............... 2004-104041

(51) Int. Cl.
*H01L 21/44* (2006.01)
(52) U.S. Cl. ...................... 438/655; 438/682
(58) Field of Classification Search ................ 438/581, 438/583, 630, 649, 651, 655, 664, 682, 721, 438/755
See application file for complete search history.

(56) References Cited

U.S. PATENT DOCUMENTS

| | | | |
|---|---|---|---|
| 6,239,452 B1 | 5/2001 | Xiang et al. | |
| 6,255,214 B1* | 7/2001 | Wieczorek et al. | 438/659 |
| 6,274,511 B1* | 8/2001 | Wieczorek et al. | 438/766 |
| 6,444,578 B1* | 9/2002 | Cabral et al. | 438/682 |
| 6,890,854 B2* | 5/2005 | Lee et al. | 438/682 |
| 6,960,781 B2* | 11/2005 | Currie et al. | 257/19 |
| 6,977,194 B2* | 12/2005 | Belyansky et al. | 438/197 |
| 7,078,285 B1* | 7/2006 | Suenaga | 438/199 |
| 2003/0235984 A1 | 12/2003 | Besser et al. | |
| 2005/0090067 A1* | 4/2005 | Jawarani | 438/305 |
| 2005/0112829 A1* | 5/2005 | Jawarani et al. | 438/301 |
| 2005/0202664 A1* | 9/2005 | Jawarani | 438/592 |

FOREIGN PATENT DOCUMENTS

JP 05-090293 4/1993

OTHER PUBLICATIONS

"Effects of nitrogen ion implantation on the formation of nickel silicide contacts on shallow junctions", Cheng et al, Thin Solid Films 355-356 (1999), pp. 412-416.*
"Nickel Silicde Formation on Si(100) and Poly-Si with a Presilicide N2 Implantation" Lee et al, Journal of Elelctronic Materials,vol. 30, 2001, pp. 1554-1559.*
"Improved NiSi Salicide Process Using Presilicide N2 Implant for MOSFETs", Lee et al, IEEE Elecrton Device Letters,vol. 21, No. 12, Dec. 2000, pp. 566-568.*

* cited by examiner

*Primary Examiner*—S. V. Clark
(74) *Attorney, Agent, or Firm*—Young & Thompson

(57) ABSTRACT

A method of manufacturing a semiconductor device that can inhibit transformation of an NiSi layer into a disilicide is to be provided. An NiSi layer is formed on gate electrodes and source/drain regions in both of a P-MOS transistor and a N-MOS transistor (a silicide layer formation step). A direct nitride layer is formed on an entire region including the NiSi layer (a nitride layer formation step). Then an element that can increase heat-resisting temperature of the NiSi layer is implanted into the NiSi layer (an element implantation step). As a result, heat-resisting property of the NiSi layer can be increased, and thereby the NiSi layer can be inhibited from being transformed into a disilicide.

4 Claims, 5 Drawing Sheets

METHOD OF MANUFACTURING A SEMICONDUCTOR DEVICE

This application is based on Japanese patent application No. 2004-104041, the content of which is incorporated hereinto by reference.

BACKGROUND OF THE INVENTION

1. Field of the Invention

The present invention relates to a method of manufacturing a semiconductor device.

2. Related Art

A conventional method of manufacturing a semiconductor device is described, for example, in JP-A Laid Open 1993-90293. The method of manufacturing disclosed in this document includes forming a monosilicide layer constituted of an NiSi on a gate electrode and a source/drain electrode of a MOS transistor, for reducing a parasitic resistance of a chip.

SUMMARY OF THE INVENTION

However, it has now been discovered that in case of employing the above method of manufacturing, the NiSi layer may be transformed into a disilicide because of a heat treatment in a subsequent process. Once the NiSi layer is transformed into a disilicide, the parasitic resistance of the MOS transistor can easily increase.

The present invention has been conceived in view of the foregoing problem, with an object to increase heat-resisting property of an NiSi layer formed in a semiconductor device and to inhibit the NiSi layer from being transformed into a disilicide, to thereby upgrade a performance of the semiconductor device.

According to the present invention, there is provided a method of manufacturing a semiconductor device provided with a MOS transistor, comprising a silicide layer formation step of forming an NiSi layer on at least one of a gate electrode and a source/drain region of the MOS transistor; and an element implantation step of implanting into the NiSi layer an inhibiter element which inhibits the NiSi layer from being transformed into a disilicide.

In this method of manufacturing, an inhibiter element which inhibits the NiSi layer from being transformed into a disilicide is introduced into the NiSi layer, in the element implantation process. As a result, heat-resisting property of the NiSi layer is increased, and consequently the NiSi layer can be inhibited from being transformed into a disilicide by a heat treatment in a subsequent process.

According to the present invention, a method of manufacturing a semiconductor device which can inhibit an NiSi layer from being transformed into a disilicide can be established.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
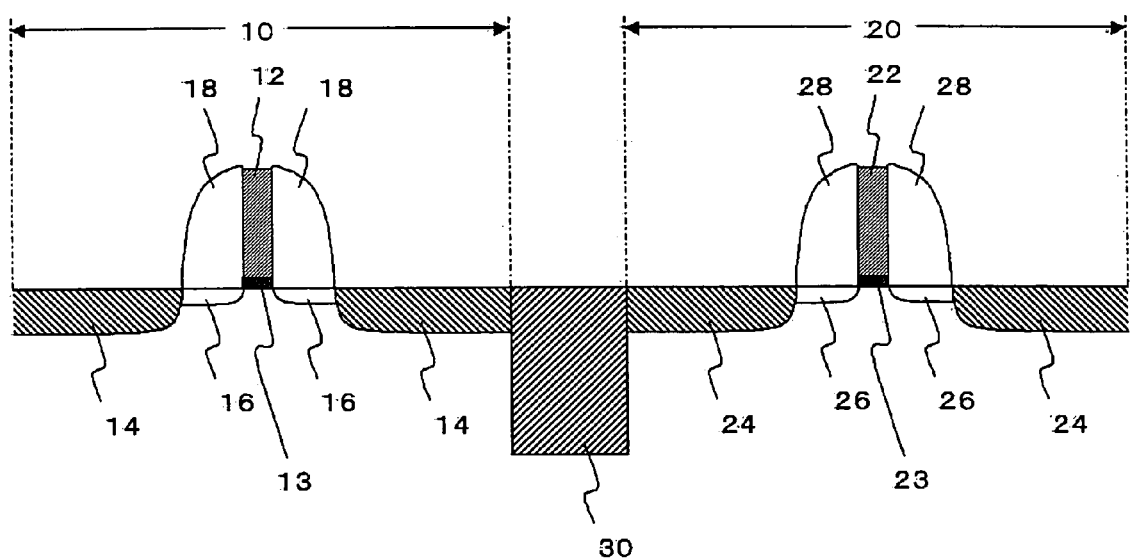
FIG. 1 is a schematic cross-sectional drawing for explaining a method of manufacturing a semiconductor device according to an embodiment of the present invention.

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

The method of manufacturing a semiconductor device may include a nitride layer formation step of forming a direct nitride layer on an NiSi layer, and the element implantation step may include implanting the element through the direct nitride layer, such that the element reaches the NiSi layer. Such method allows relaxing a stress in the direct nitride layer, in addition to inhibiting the NiSi layer from being transformed into a disilicide.

In the present invention, the semiconductor device may be provided with a P-MOS transistor and an N-MOS transistor, and the direct nitride layer may have a tensile stress. Here, the element may be implanted only on the NiSi layer formed on the P-MOS transistor among those formed in the P-MOS transistor and the N-MOS transistor, in the element implantation process. In case where the direct nitride layer has a tensile stress, a drive current of the P-MOS transistor decreases, while a drive current of the N-MOS transistor increases. Accordingly, performing the element implantation only in the region of the P-MOS transistor in the element implantation process allows relaxing the tensile stress, and thereby restraining a decrease of a drive current in the P-MOS transistor.

In the present invention, the semiconductor device may be provided with a P-MOS transistor and an N-MOS transistor, and the direct nitride layer may have a compressive stress. Here, the element may be implanted only on the NiSi layer formed on the N-MOS transistor among those formed in the P-MOS transistor and the N-MOS transistor, in the element implantation process. In case where the direct nitride layer has a compressive stress, a drive current of the N-MOS transistor decreases, while a drive current of the P-MOS transistor increases. Accordingly, performing the element implantation only in the region of the N-MOS transistor in the element implantation process allows relaxing the compressive stress, and thereby restraining a decrease of an on current in the N-MOS transistor.

The NiSi layer may be constituted of an NiSi. Since an NiSi has a low resistance, the NiSi may suitably perform as a silicide layer.

The element to be implanted may be at least one selected out of a group consisting of Ge, N, F, O and C. These elements may have a role to suppress transformation into a disilicide by increasing the heat-resisting temperature of the NiSi layer and to relax the stress of the direct nitride layer by increasing the heat-resisting temperature of the NiSi layer Hereunder, a preferred embodiment of a method of manufacturing a semiconductor device according to the present invention will be described in details, referring to the accompanying drawings. Here, same constituents are given an identical numeral in all the drawings, and a duplicating description thereof will be omitted.

Referring to FIGS. 1 to 6, the embodiment of the method of manufacturing a semiconductor device according to the present invention will be described. The semiconductor device to be manufactured in this embodiment is a CMOS transistor device provided with a P-MOS transistor and an N-MOS transistor.

Firstly, as shown in FIG. 1, the P-MOS transistor 10 and the N-MOS transistor 20 are formed on a silicon substrate. The P-MOS transistor 10 includes a gate electrode 12, a gate oxide layer 13, a source/drain region 14, an LDD (Lightly Doped Drain) region 16 and a spacer 18. Likewise, the N-MOS transistor 20 includes a gate electrode 22, a gate oxide layer 23, a source/drain region 24, an LDD region 26 and a spacer 28. The P-MOS transistor 10 and the N-MOS transistor 20 are isolated from each other by an STI (Shallow Trench Isolation) region 30, which is an isolating region.

Figure 2:
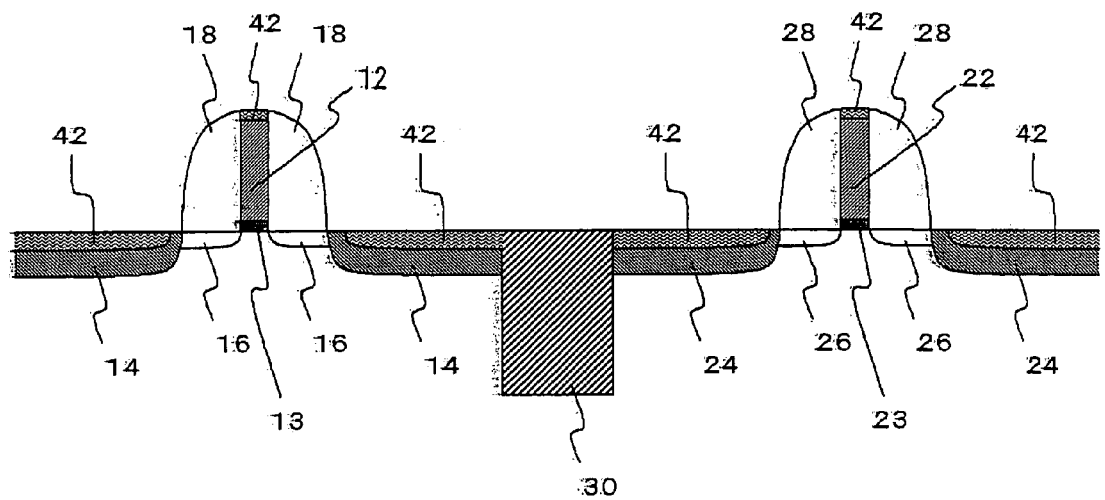
FIG. 2 is a schematic cross-sectional drawing for explaining a method of manufacturing a semiconductor device according to the embodiment of the present invention.

Then as shown in FIG. 2, an NiSi layer 42 as a monosilicide layer is formed on the gate electrodes 12, 22 and the source/drain regions 14, 24 in both of the P-MOS transistor 10 and the N-MOS transistor 20 (the silicide layer formation step). Here, the NiSi layer 42 may be formed only on either of the gate electrodes 12, 22 and the source/drain regions 14, 24.

Figure 3:
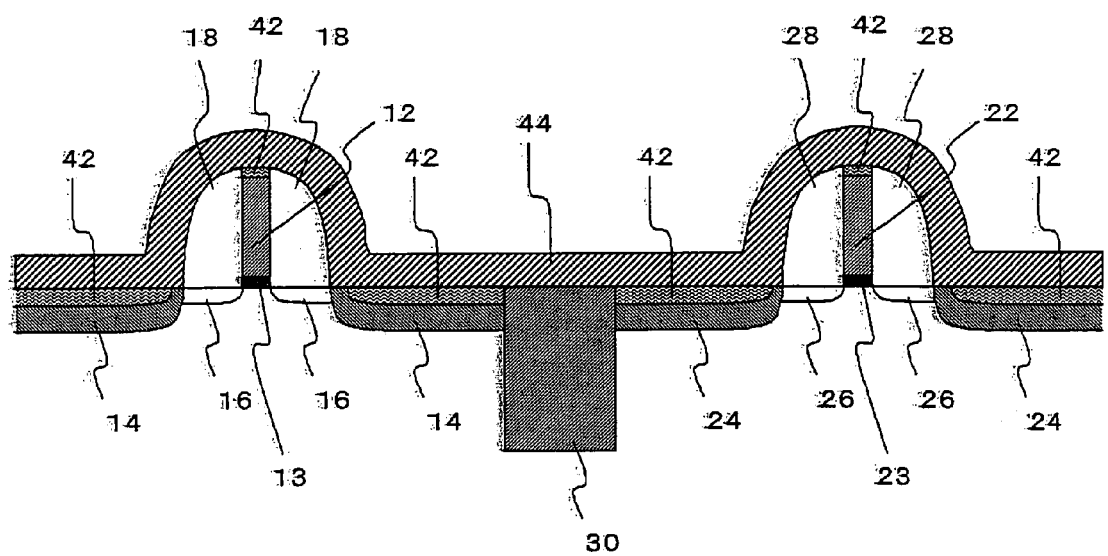
FIG. 3 is a schematic cross-sectional drawing for explaining a method of manufacturing a semiconductor device according to the embodiment of the present invention.

Then, as shown in FIG. 3, a direct nitride layer 44, which is interlayer nitride film, is formed on an entire region including the NiSi layer 42 (the nitride layer formation step). The direct nitride layer 44 is intended to constitute an interlayer dielectric film together with an interlayer oxide film 46 to be described later. Also, in this embodiment the direct nitride layer 44 has a tensile stress. The direct nitride layer 44 may be constituted of an SiN, for example.

Figure 4:
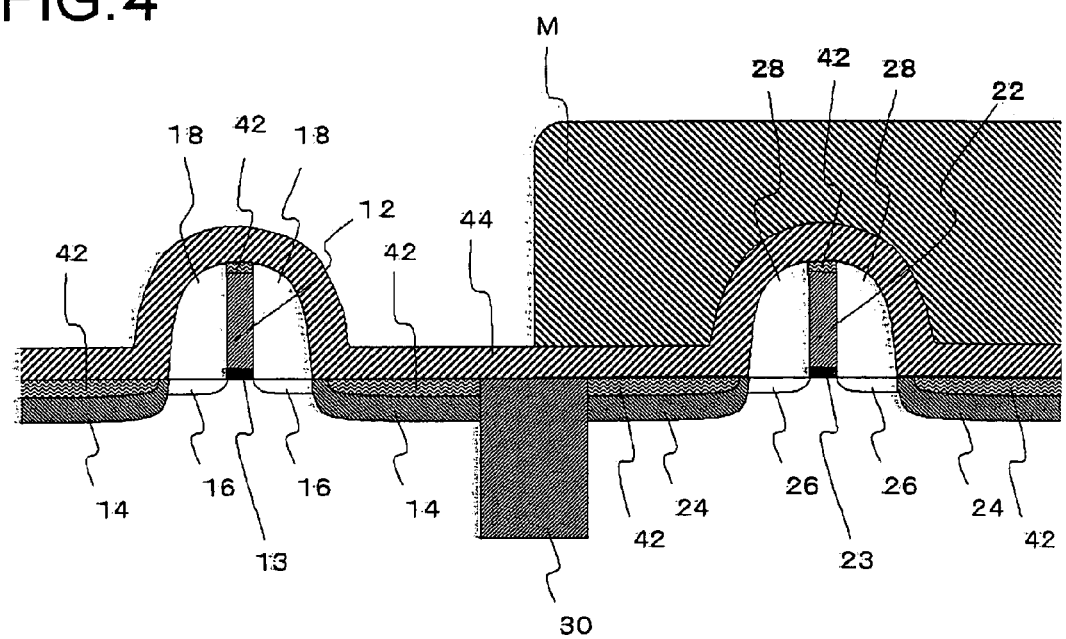
FIG. 4 is a schematic cross-sectional drawing for explaining a method of manufacturing a semiconductor device according to the embodiment of the present invention.

Then, as shown in FIG. 4, a mask M is formed over an entirety of the N-MOS transistor 20, utilizing a photoresist.

Figure 5:
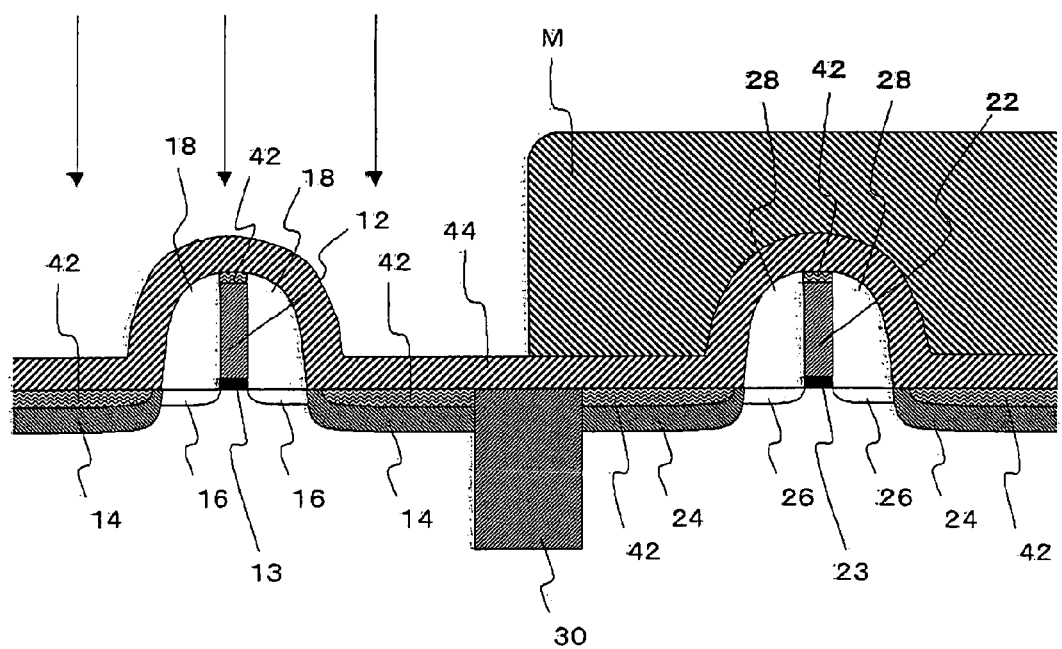
FIG. 5 is a schematic cross-sectional drawing for explaining a method of manufacturing a semiconductor device according to the embodiment of the present invention.

Referring then to FIG. 5, an element that can increase heat-resisting temperature of the NiSi layer 42 (hereinafter referred to as an "inhibiter element") is implanted into the NiSi layer 42 (the element implantation step). At this stage, since a region of the N-MOS transistor 20 is covered with the mask M, inhibiter element is implanted only in a region of the P-MOS transistor 10. An implantation condition is to be set such that the inhibiter element reaches the NiSi layer 42. Examples of the inhibiter element include Ge, N, F, O and C. These elements can increase heat-resisting temperature of the NiSi layer 42 so as to inhibit the NiSi layer 42 from being transformed into a disilicide, and also relax the stress of the direct nitride layer. Here, just one of the inhibiter elements may be implanted, while a plurality of the inhibiter elements may be implanted in combination.

Figure 6:
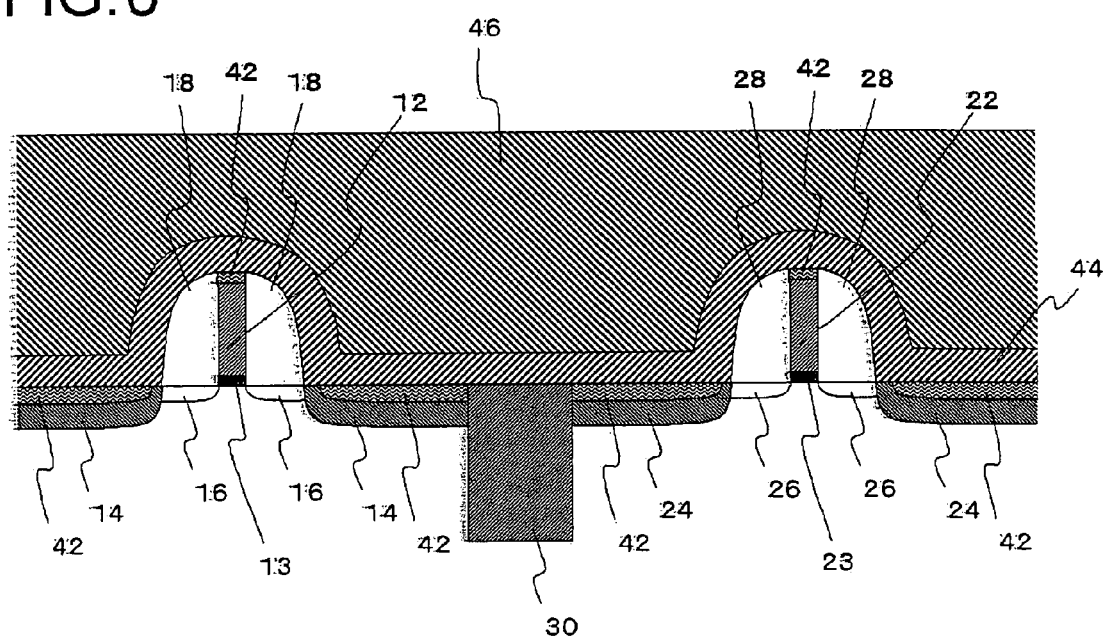
FIG. 6 is a schematic cross-sectional drawing for explaining a method of manufacturing a semiconductor device according to the embodiment of the present invention.

Finally, as shown in FIG. 6, interlayer oxide film 46 is formed on the direct nitride layer 44. For example, an $SiO_2$ may be employed as the interlayer oxide film 46.

Now, advantageous effect of the method of manufacturing a semiconductor device according to the foregoing embodiment will be described.

In the above method of manufacturing a semiconductor device, the inhibiter element is implanted into the NiSi layer 42, in the element implantation process. Because of this, heat-resisting property of the NiSi layer 42 is increased, so that the NiSi layer 42 can be inhibited from being transformed into a disilicide due to a heat treatment in a subsequent process. Since an $NiSi_2$ has a higher sheet resistance value than that of an NiSi, it is quite important to inhibit transformation of the NiSi into a disilicide for the purpose of reducing the parasitic resistance of the chip. Also, though the transformation of the NiSi into a disilicide leads to an increase of a leak current, the proposed method of manufacturing can also inhibit the increase of such leak current.

Also, introduction of the inhibiter element into the NiSi layer 42 is performed through the implantation step after the formation of the NiSi layer 42. Therefore, it is easy to independently control an implantation amount to the P-MOS transistor 10 and that on the N-MOS transistor 20. For example, in this embodiment, since the mask M is employed, the implantation only on the NiSi layer 42 formed in the P-MOS transistor 10, out of those formed in the P-MOS transistor 10 and the N-MOS transistor 20, can be quite easily executed.

Meanwhile, for introducing an inhibiter element into the NiSi layer, the inhibiter element may be mixed in a sputtering gas used for depositing the Ni layer. However, this method is undesirable because the implantation amount cannot be independently controlled for the NiSi layer 42 in the region of the P-MOS transistor 10 and for that in the region of the N-MOS transistor 20. Moreover, in the case where, for example, As is introduced as an impurity in the N-MOS transistor 20, since As also serves to increase a heat-resisting temperature of the NiSi layer, introducing a same amount of inhibiter element by sputtering in both of the P-MOS transistor 10 and the N-MOS transistor 20 results in introducing a greater amount of elements that increase the heat-resisting temperature of the NiSi layer in the region of the N-MOS transistor 20, than in the region of the P-MOS transistor 10. Consequently, it becomes difficult to set a well-equilibrated reaction temperature between the P-MOS transistor 10 and the N-MOS transistor 20, when forming the NiSi layer.

On the contrary, the method according to this embodiment, that is, performing the implantation of the inhibiter element after the formation of the NiSi layer 42 allows preventing the above problem, since the inhibiter element has not yet been introduced at the step of forming the NiSi layer 42.

Further, in the element implantation step, the implantation condition is to be set such that the inhibiter element reaches the NiSi layer 42. Here, taking into account a possible damage to the substrate due to the implantation or an impact to the gate oxide layer, it is desirable that the inhibiter element is not implanted into the substrate and the gate oxide layer. In this respect, since an implanted substance tends to stop in a metal, it is easy to determine an implantation condition such that the inhibiter element stops in the NiSi layer 42.

In this embodiment particularly, the inhibiter element is implanted through the direct nitride layer 44. This provides an additional advantage of relaxing a stress in the direct nitride layer 44, not only inhibiting the NiSi layer 42 from being transformed into a disilicide.

Also, the implantation of the inhibiter element is performed only on the NiSi layer 42 formed in the P-MOS transistor 10. Since the direct nitride layer 44 has a tensile stress, the direct nitride layer 44 increases a drive current of the N-MOS transistor, while decreasing a drive current of the P-MOS transistor. Accordingly, performing the element implantation only in the region of the P-MOS transistor 10 allows inhibiting a decrease in a drive current of the P-MOS transistor 10.

Also, while this embodiment describes a case where the direct nitride layer having a tensile stress is employed and the inhibiter element is implanted only in the region of the P-MOS transistor 10, a direct nitride layer having a compressive stress may also be employed, in which case the inhibiter element is to be implanted only in the region of the N-MOS transistor 20.

Further, in this embodiment, the interlayer dielectric film, which has a structure that is formed the direct nitride layer 44 and the interlayer oxide film 46, is formed. An advantage of such structure is that the direct nitride layer 44 can serve as an etching stopper, when stripping the interlayer dielectric film by etching, for forming a contact or the like. However, it is not necessary to provide the direct nitride layer 44. In the case where the direct nitride layer 44 is not provided, that is, when skipping the step of forming the nitride layer, the element implantation step may be performed immediately after the silicide layer formation step. In this case, the inhibiter element may be implanted either in both regions of the P-MOS transistor 10 and the N-MOS transistor 20, or only in one of these regions.

Figure 7:
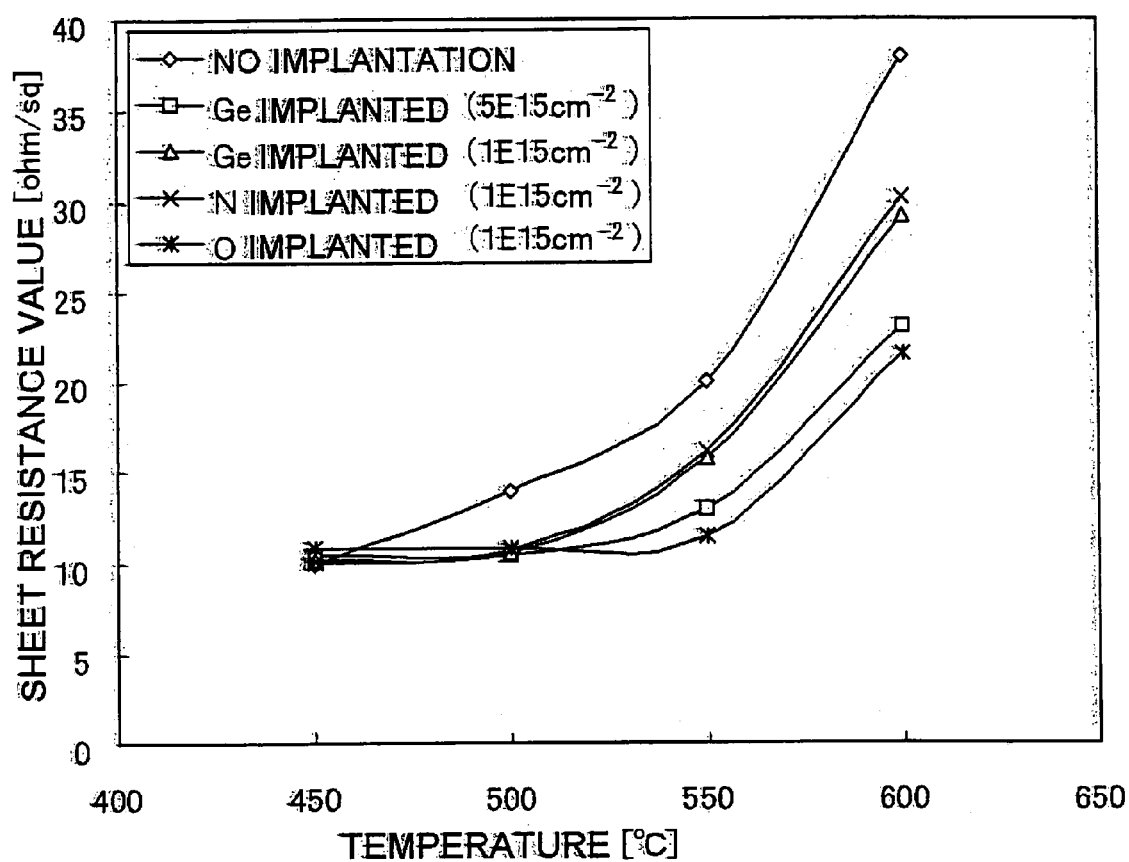
FIG. 7 is a line graph for explaining an advantageous effect of the method of manufacturing a semiconductor device according to the present invention.

FIG. 7 is a line graph showing variation of heat-resisting temperature in terms of a temperature limit for the NiSi layer, in the respective cases that the inhibiter element has been implanted and has not been implanted in the NiSi layer. The implantation of the inhibiter element has been performed through the direct nitride layer. The temperature limit herein referred to means a temperature at which the NiSi layer is transformed into a disilicide, that is, an $NiSi_2$ layer. The vertical axis of the graph represents a sheet resistance value ($\Omega/\square$), and the horizontal axis represents a temperature (degree centigrade). Based on the fact that a sheet resistance value of nickel increases when transformed into a disilicide, it is apparent from the graph that the temperature limit rises above 500 degree centigrade when the inhibiter element is implanted, while the temperature limit is around 450 degree centigrade in the case where the implantation has not been performed. Accordingly, implanting the inhibiter element allows increasing heat-resisting temperature of the NiSi layer, and thereby inhibiting the NiSi layer from being transformed into a disilicide.

It is apparent that the present invention is not limited to the above embodiment, that may be modified and changed without departing from the scope and spirit of the invention.

What is claimed is:

1. A method of manufacturing a semiconductor device provided with a MOS transistor, comprising:
   - a silicide layer formation step of forming an NiSi layer on at least one of a gate electrode and a source/drain region of said MOS transistor;
   - an element implantation step of implanting into said NiSi layer an inhibiter element which inhibits said NiSi layer from being transformed into a disilicide; and
   - a nitride layer formation step of forming an interlayer nitride film on said NiSi layer,
   - wherein said element implantation step includes implanting said element through said interlayer nitride film, such that said element reaches said NiSi layer.

2. The method according to claim 1, said semiconductor device being provided with a P-MOS transistor and an N-MOS transistor, and said interlayer nitride film having a tensile stress,
   - wherein said element implantation step includes implanting said element only on said NiSi layer formed on said P-MOS transistor among those formed on said P-MOS transistor and said N-MOS transistor.

3. The method according to claim 1, said semiconductor device being provided with a P-MOS transistor and an N-MOS transistor, and said interlayer nitride film having a compressive stress,
   - wherein said element implantation step includes implanting said element only on said NiSi layer formed on said N-MOS transistor among those formed on said P-MOS transistor and said N-MOS transistor.

4. The method according to claim 1, wherein said inhibiter element implantation step includes implanting at least one element selected out of a group consisting of Ge, N, F, O and C.

* * * * *